(12) United States Patent
Oh et al.

(10) Patent No.: US 12,193,235 B2
(45) Date of Patent: Jan. 7, 2025

(54) NONVOLATILE MEMORY DEVICE AND APPARATUS INCLUDING THE SAME

(71) Applicant: Samsung Electronics Co., Ltd., Suwon-si (KR)

(72) Inventors: Youngtek Oh, Suwon-si (KR); Hyeyoung Kwon, Hwaseong-si (KR); Taein Kim, Seoul (KR); Gukhyon Yon, Hwaseong-si (KR); Minhyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 454 days.

(21) Appl. No.: 17/537,984

(22) Filed: Nov. 30, 2021

(65) Prior Publication Data

US 2022/0320135 A1 Oct. 6, 2022

(30) Foreign Application Priority Data

Apr. 1, 2021 (KR) .................. 10-2021-0042894

(51) Int. Cl.
*H10B 43/27* (2023.01)

(52) U.S. Cl.
CPC .................................. *H10B 43/27* (2023.02)

(58) Field of Classification Search
CPC .......... H01L 29/40117; H01L 29/4234; H01L 29/792; H10B 43/27; H10B 43/30
See application file for complete search history.

(56) References Cited

U.S. PATENT DOCUMENTS

| | | |
|---|---|---|
| 8,674,430 B2 | 3/2014 | Yasuda et al. |
| 8,853,773 B2 | 10/2014 | Lee |
| 8,963,232 B2 | 2/2015 | Yasuda et al. |
| 9,406,811 B2 | 8/2016 | Higuchi et al. |
| 9,865,616 B2 | 1/2018 | Shimizu et al. |
| 10,453,855 B2 | 10/2019 | Carlson et al. |
| 2011/0266611 A1 | 11/2011 | Kim et al. |
| 2014/0367763 A1 | 12/2014 | Yasuda |
| 2019/0139983 A1* | 5/2019 | Lee ................... H01L 29/42352 |

* cited by examiner

*Primary Examiner* — Wasiul Haider
(74) *Attorney, Agent, or Firm* — HARNESS, DICKEY & PIERCE, P.L.C.

(57) ABSTRACT

A nonvolatile memory device includes a channel layer, a plurality of gate electrodes and a plurality of separation layers spaced apart from the channel layer and alternately arranged, a charge trap layer between the gate electrodes in the channel layer, and a charge blocking layer between the charge trap layer and the gate electrode.

21 Claims, 19 Drawing Sheets

NONVOLATILE MEMORY DEVICE AND APPARATUS INCLUDING THE SAME

CROSS-REFERENCE TO RELATED APPLICATION

This application claims the benefit of Korean Patent Application No. 10-2021-0042894, filed on Apr. 1, 2021, in the Korean Intellectual Property Office, the disclosure of which is incorporated herein in their entirety by reference.

BACKGROUND

1. Field

The disclosed embodiments relate to a nonvolatile memory device, an apparatus including the nonvolatile memory device, and/or a method of manufacturing the nonvolatile memory device.

2. Description of Related Art

A nonvolatile memory device may be a semiconductor memory device. A nonvolatile memory device may maintain stored data even when the supply of power thereto is stopped, and may include, for example, programmable read-only memory (PROM), erasable PROM (EPROM), electrically EPROM (EEPROM), flash memory, and so on.

In order to increase a capacity of the nonvolatile memory device, it may be necessary to increase a density between memory cells while limiting and/or preventing diffusion of electric charges between the memory cells.

SUMMARY

Provided is a nonvolatile memory device capable of reducing diffusion of electric charges between memory cells.

Additional aspects will be set forth in part in the description which follows and, in part, will be apparent from the description, or may be learned by practice of the presented embodiments of the disclosure.

According to an embodiment, a nonvolatile memory device may include a channel layer extending in a first direction, a plurality of gate electrodes and a plurality of separation layers spaced apart from the channel layer and alternately arranged in the first direction, a plurality of charge trap layers between the plurality of gate electrodes and the channel layer, and a plurality of charge blocking layers between the plurality of charge trap layers and the plurality of gate electrodes. The plurality of separation layers may separate the plurality of charge trap layers from each other. The plurality of separation layers may separate the plurality of charge blocking layers from each other. Each corresponding charge trap layer among the plurality of charge trap layers, corresponding charge blocking layer among the plurality of charge blocking layers, and corresponding gate electrode among the plurality of gate electrodes may be in direct contact with a corresponding separation layer among the plurality of separation layers.

In some embodiments, the nonvolatile memory device may further include a charge tunneling layer between the channel layer and the plurality of charge trap layers. The charge tunneling layer may surround the channel layer without being separated by the plurality of separation layers.

In some embodiments, the charge tunneling layer may be in direct contact with the plurality of separation layers.

In some embodiments, at least one of the corresponding charge trap layer and the corresponding charge blocking layer may include a tapered region in which a thickness gradually decreases toward the corresponding gate electrode.

In some embodiments, intervals between the plurality of gate electrodes may be 50 nm or less.

In some embodiments, the plurality of charge blocking layers may include at least one of silicon oxide and metal oxide.

In some embodiments, a material in the plurality of separation layers may different from a material of the plurality of charge blocking layers.

In some embodiments, the plurality of separation layers may have a trap density less than $1 \times 10^{19}$ cm$^{-3}$.

In some embodiments, the separation layer may include a first separation layer and a second separation layer. The second separation layer may surround the first separation layer. The second separation layer in the corresponding separation layer and may contact the channel layer, the corresponding charge trap layer, and the corresponding charge blocking layer.

In some embodiments, a thickness of the first separation layer may be greater than a thickness of the second separation layer.

In some embodiments, a thickness of the first separation layer may be 50 nm or less, and a thickness of the second separation layer may be 5 nm or less.

In some embodiments, a trap energy concentration of the first separation layer and a trap energy concentration of the second separation layer may be different from each other.

In some embodiments, the trap energy concentration of the second separation layer may be higher than the trap energy concentration of the first separation layer.

In some embodiments, the trap energy concentration of the second separation layer may be less than $1 \times 10^{19}$ cm$^{-3}$.

In some embodiments, a hardness of the first separation layer may be greater than a hardness of the second separation layer.

In some embodiments, the second separation layer may be formed of a material with a dielectric constant of 10 or less.

In some embodiments, the second separation layer may include at least one of $Al_2O_3$, carbon-doped silicon dioxide (SiOC), fluorine-doped silicon dioxide (SiOF), and hexagonal boron nitride (h-BN).

In some embodiments, the first separation layer may include at least one of silicon nitride and silicon oxide.

In some embodiments, nonvolatile memory device may further include a bit line connected to a drain on an end of the channel layer, a source line connected to a source connected to an other end of the channel layer, and a plurality of word lines respectively connected to the plurality of gate electrodes.

According to an embodiment, a nonvolatile memory device may include a common source line and a plurality of strings connected to the common source line. Each of the plurality of strings may include a channel layer extending in a first direction, a charge tunneling layer extending in the first direction along the channel layer, a plurality of separation layers and a plurality of charge trap layers alternately arranged in the first direction along a surface of the charge tunneling layer, a plurality of gate electrodes alternately arranged in the first direction with the plurality of separation layers, and a plurality of charge blocking layers alternately arranged in the first direction with the plurality of separation layers. The plurality of strings may be spaced apart from each other. The charge tunneling layer may extend between the channel layer and the plurality of charge trap layers. The plurality of charge blocking layers may separate the plurality of gate electrodes from the plurality of charge trap layers. The plurality of charge trap layers may separate the plurality of charge trap layers from each other.

In some embodiments, the plurality of charge trap layers may directly contact the charge tunneling layer.

In some embodiments, the plurality of charge trap layers may have a tapered shape such that thicknesses of the plurality of charge trap layers decrease in the first direction toward the plurality of gate electrodes.

In some embodiments, intervals between the plurality of gate electrodes may be 50 nm or less.

In some embodiments, an electronic apparatus may include the nonvolatile memory device; a plurality of drains on the plurality of strings; a plurality of word lines connected to the plurality of strings, each of the plurality of word lines connecting the plurality of gate electrodes at a same height to each other; and a plurality of bit lines connected to the plurality of strings through corresponding drains among the plurality of drains.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
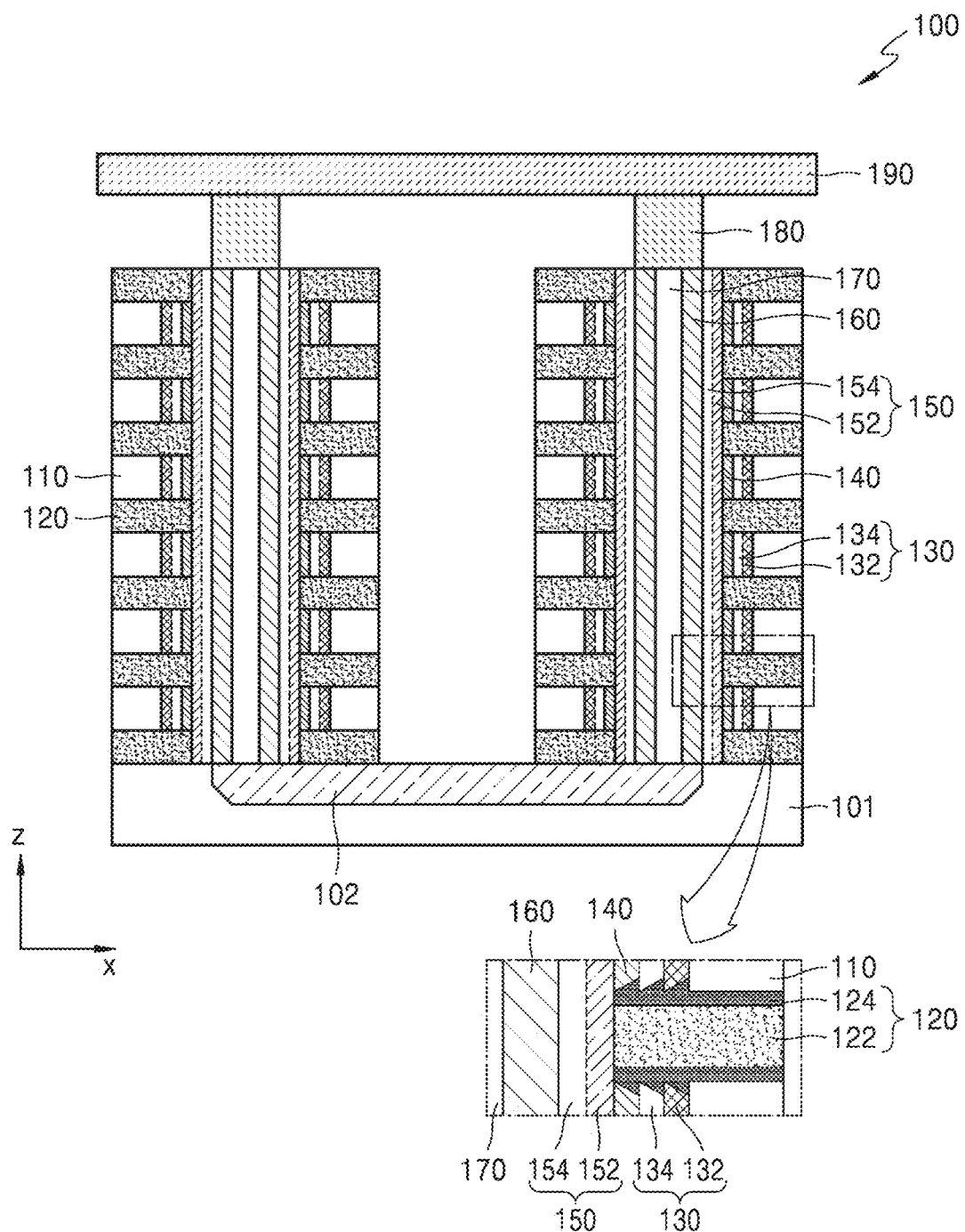
FIG. 1 is a cross-sectional view illustrating a schematic structure of a nonvolatile memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, embodiments will be described in detail with reference to the accompanying drawings. The embodiments to be described are merely examples, and various modifications may be made from the embodiments. In the following drawings, the same reference numerals refer to the same components, and a size of each component in the drawings may be exaggerated for the sake of clear and convenient description.

Hereinafter, what is described as "upper portion" or "on" may also include not only components directly thereon in contact therewith but also components thereon without being in contact therewith.

Terms such as first and second may be used to describe various components but are used only for the purpose of distinguishing one component from another component. These terms are not intended to limit differences in materials or structures of components.

Singular expressions include plural expressions unless the context clearly indicates otherwise. In addition, when a portion "includes" a certain component, this means that other components may be further included rather than excluding other components unless specifically stated to the contrary.

In addition, terms such as " . . . unit", " . . . portion", and "module" described in the specification mean units that process at least one function or operation, which may be implemented as hardware or software, or as a combination of hardware and software.

Use of a term "the" and similar reference terms may correspond to both the singular and the plural.

Steps constituting a method may be performed in any suitable order unless there is a clear statement that the steps constituting the method should be performed in the order described. In addition, use of all example terms (for example, and so on) is merely for describing technical ideas in detail, and the scope of claims is not limited by the terms unless limited by the claims.

Figure 2:
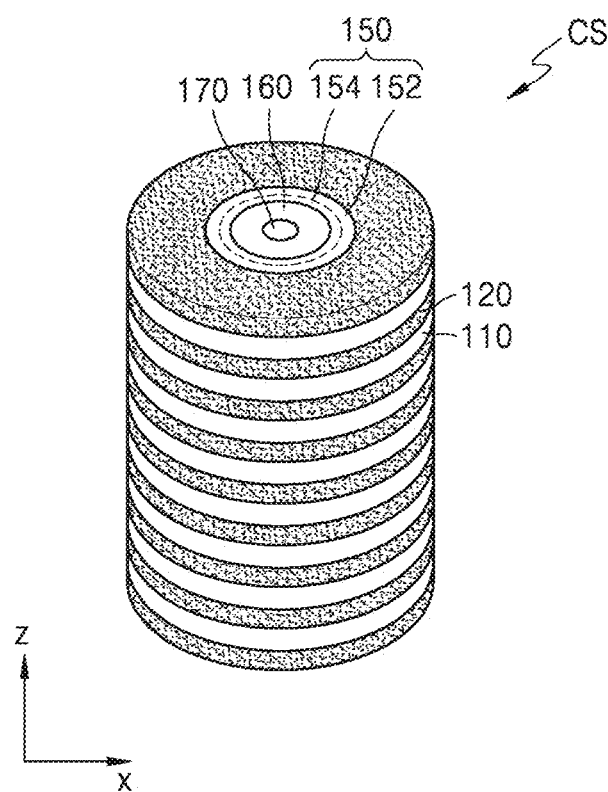
FIG. 2 is a perspective view illustrating a schematic structure of a memory string included in the nonvolatile memory device of FIG. 1.
Figure 3:
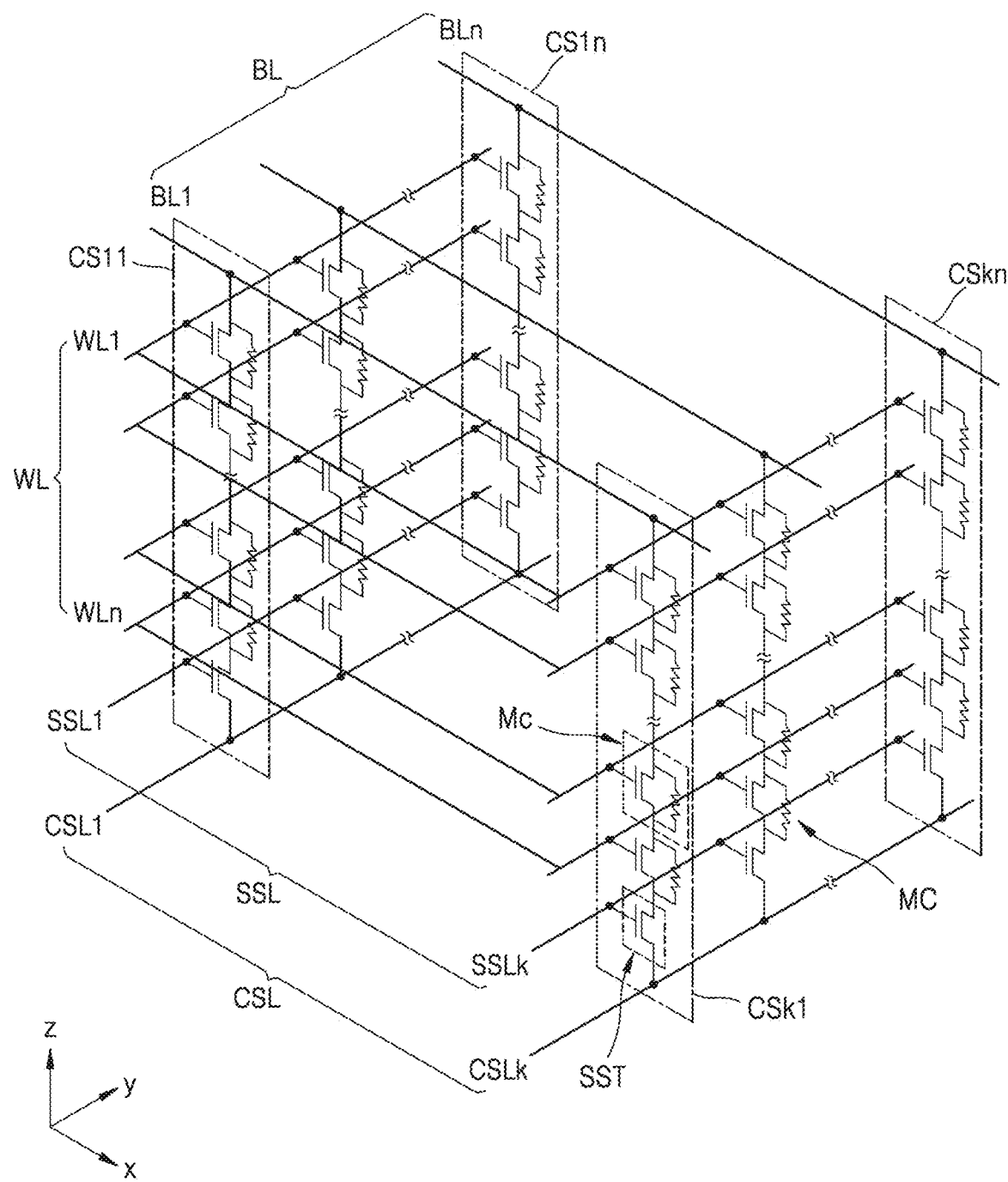
FIG. 3 is an equivalent circuit diagram of the nonvolatile memory device of FIG. 1.

FIG. 1 is a cross-sectional view illustrating a schematic structure of a nonvolatile memory device 100 according to an embodiment, and FIG. 2 is a perspective view illustrating a schematic structure of a memory string included in the nonvolatile memory device 100 of FIG. 1. FIG. 3 is an equivalent circuit diagram of the nonvolatile memory device 100 of FIG. 1.

The nonvolatile memory device 100 according to the present embodiment may be a vertical NAND (VNAND) memory in which a plurality of memory cells MC are vertically arrayed.

A detailed configuration of the nonvolatile memory device 100 will be described below with reference to FIGS. 1 to 3. First, referring to FIG. 1, a plurality of cell strings are formed on a substrate 101.

The substrate 101 may include a semiconductor material doped with a first type impurity. For example, the substrate 101 may include a silicon material doped with a p-type impurity. For example, the substrate 101 may be a p-type well (for example, a pocket p-well). Hereinafter, it is assumed that the substrate 101 is p-type silicon. However, the substrate 101 is not limited to p-type silicon.

A doped region 102 is provided in the substrate 101. For example, the doped region 102 may be doped with a second type impurity that is different from the substrate 101. For example, the doped region 102 may be doped with an n-type impurity. Hereinafter, it is assumed that the doped region 102 may be doped with an n-type impurity. However, the doped region 102 is not limited to an n-type impurity. The doped region 102 may be connected to a common source line CSL.

k*n cell strings CS may be provided and arranged in a matrix as illustrated in the circuit diagram of FIG. 3 and may be referred to as CSij (1≤i≤k and 1≤j≤n) depending on the positions of respective rows and columns. Each of the cell strings CSij is connected to a bit line BL, a string select line SSL, a word line WL, and the common source line CSL.

Each of the cell strings CSij includes memory cells MC and a string select transistor SST. The memory cells MC of each of the cell strings CSij and the string select transistor SST may be stacked in a height direction.

Rows of the plurality of cell strings CS are respectively connected to string select lines SSL1 to SSLk that are different from each other. For example, the string select transistors SST of the cell strings CS11 to CS1n are commonly connected to the string select line SSL1. The string select transistors SST of the cell strings CSk1 to CSkn are commonly connected to the string select line SSLk.

Columns of the plurality of cell strings CS are respectively connected to bit lines 190 or BL1 to BLn. For example, the memory cells MC and the string select transistors SST of the cell strings CS11 to CSk1 may be commonly connected to the bit line 190 or BL1, and the memory cells MC and the string select transistors SST of the cell strings CS1n to CSkn may be commonly connected to the bit line 190 or BLn.

The rows of the plurality of cell strings CS may be respectively connected to the common source lines CSL1 to CSLk that are different from each other. For example, the string select transistors SST of the cell strings CS11 to CS1n may be commonly connected to the common source line CSL1, and the string select transistors SST of the cell strings CSk1 to CSkn may be commonly connected to the common source line CSLk.

The memory cells MC at the same height from the substrate 101 or the string select transistors SST may be commonly connected to one word line WL, and the memory cells MC at different heights may be respectively connected to the word lines WL1 to WLm that are different from each other.

The illustrated circuit structure is an example. For example, the number of rows of the cell strings CS may be increased or decreased. As the number of rows of the cell string CS is changed, the number of string select lines connected to the rows of the cell string CS and the number of cell strings CS connected to one bit line 190 also may be changed. As the number of rows of the cell strings CS is changed, the number of common source lines connected to the rows of the cell strings CS also may be changed.

The number of columns of the cell strings CS also may be increased or decreased. As the number of columns of the cell string CS is changed, the number of bit lines 190 connected to the columns of the cell strings CS and the number of cell strings CS connected to one string select line also may be changed.

Heights of the cell strings CS also may be increased or decreased. For example, the number of stacked memory cells MC in each of the cell strings CS may be increased or decreased. As the number of stacked memory cells MC in each of the cell strings CS is changed, the number of word lines WL also may be changed. For example, the number of string select transistors provided to each of the cell strings CS may be increased. As the number of string select transistors provided to each of the cell strings CS is changed, the number of string select lines or the number of common source lines also may be changed. When the number of string select transistors is increased, the string select transistors may be stacked in the same shape as the memory cells MC.

For example, write and read may be performed in units of rows of the cell strings CS. The cell strings CS may be selected in units of rows by the common source line CSL, and the cell strings CS may be selected in units of one row by the string select lines SSL. In addition, a voltage may be applied to the common source lines CSL in a state in which at least two common source lines are set as a unit. The voltage may be applied to the common source lines CSL in a state in which all the common source lines CSL are set as a unit.

In the selected row of the cell strings CS, write and read may be performed in units of pages. A page may be one row of memory cells connected to one word line WL. In the selected row of cell strings CS, memory cells may be selected in units of pages by the word lines WL.

As illustrated in FIG. 1, the cell string CS includes a cylindrical channel hole, and a plurality of gate electrodes 110 and a plurality of separation layers 120 surrounding the cylindrical channel hole CH in a ring shape. The plurality of gate electrodes 110 and the plurality of separation layers 120 may be alternately stacked with each other in a vertical direction (Z direction).

Each of the gate electrodes 110 may be formed of a metal material or a silicon material doped with a high concentration. Each of the gate electrodes 110 is connected to one of the word line WL and the string select line SSL.

The separation layers 120 may serve as spacers for insulation between conductive layers. The separation layers 120 will be described below.

The separation layers 120 and the gate electrodes 110 are formed such that the channel hole CH passes therethrough. Here, the channel hole CH may be formed to extend in a direction (that is, the z-axis direction in FIG. 2) perpendicular to a surface of the substrate 101. The channel hole CH may be formed to have a circular cross-section.

A charge blocking layer 130, a charge trap layer 140, a charge tunneling layer 150, and a channel layer 160 are sequentially provided on an inner wall of the channel hole CH. Here, when a certain voltage is applied to the gate electrode 110, electric charges flowing between a source and a drain 180 on the channel layer 160 pass through the charge tunneling layer 150 and are trapped in the charge trap layer 140, and thus, information is stored.

Each of the charge blocking layer 130, the charge trap layer 140, and the charge tunneling layer 150 may be provided to extend in a direction perpendicular to a surface of the substrate 101. Each of the charge blocking layer 130, the charge trap layer 140, and the charge tunneling layer 150 may be provided to have a cylindrical shape.

The charge blocking layer 130 may be provided on the inner wall of the channel hole CH to be in contact with the separation layer 120 and the gate electrode 110.

The channel layer 160 may include a semiconductor material doped with a first type impurity. The channel layer 160 may include a silicon material doped with the same type of impurity as the substrate 101, and for example, when the substrate 101 includes a silicon material doped with a p-type impurity, the channel layer 160 may also include the silicon material doped with the p-type impurity. Alternatively, the channel layer 160 may also include a material such as Ge, IGZO, or GaAs. The channel layer 160 may have a cylindrical shape.

The inside of the channel layer 160 may be filled with a filling layer 170. The filling layer 170 may include, for example, silicon oxide or air, but is not limited thereto.

The channel layer 160 may be in contact with the doped region 102, that is, a common source region.

The drain 180 may be provided in the channel hole CH. The drain 180 may include a silicon material doped with a second type impurity. For example, the drain 180 may include a silicon material doped with an n-type impurity.

The bit line 190 may be provided on the drain 180. The drain 180 and the bit line 190 may be connected to each other through a contact plug.

Each of the gate electrodes 110, and the separation layer 120, and the channel layer 160 at positions facing the gate electrode 110 in the horizontal direction (X direction) may constitute the memory cell MC. That is, the memory cell MC may have a circuit structure in which a transistor including the gate electrode 110, the separation layer 120, and the channel layer 160 is connected in parallel to the charge trap layer 140.

The memory cells MC are continuously arranged in the vertical direction (Z direction) to constitute the cell string CS. In addition, both ends of the cell string CS may be connected to the common source line CSL and the bit line BL, as illustrated in the circuit diagram of FIG. 3. By applying a voltage to the common source line CSL and the bit line BL, a program process, a read process, and an erasure process may be performed on the plurality of memory cells MC.

For example, when the memory cell MC to be written is selected, a gate voltage value of the cell is adjusted such that a channel is not formed in the selected cell, that is, the channel is off, and the gate voltage values of unselected cells are adjusted such that channels are on. Accordingly, a current path by a voltage applied to the common source line CSL and the bit line BL passes through the selected memory cell MC, and in this case, the applied voltage may be set to Vset or Vreset to cause the memory cell MC to be in a low resistance state or a high resistance state, and desirable information of 1 or 0 may be written to the selected memory cell MC.

During a read operation, a read of a selected memory cell may be performed similarly thereto. That is, after a gate voltage applied to the gate electrode 110 is adjusted such that the selected memory cell MC is in a channel-off state and the unselected memory cells are in a channel-on state, a memory cell state (1 or 0) may be checked by measuring a current flowing through the memory cell MC due to an application voltage Vread between the common source line CSL and the bit line BL.

The nonvolatile memory device 100 according to an embodiment has a structure in which memory cells are vertically connected to each other. When information is stored, electric charges diffuse in the vertical direction to move to an adjacent cell, thereby affecting an operation of the adjacent cell. Accordingly, the charge trap layer 140 of the nonvolatile memory device 100 according to the embodiment is separated from the separation layer 120 for each cell.

Specifically, the charge tunneling layer 150, the charge trap layer 140, and the charge blocking layer 130 may be sequentially arranged from the channel layer 160 toward the gate electrode 110. In addition, the charge trap layer 140 and the charge blocking layer 130 may be separated by the separation layer 120 such that the memory cells may not be connected to each other. In addition, the charge tunneling layer 150 is not separated by the separation layer 120, and thus, the memory cells are connected to each other to surround the channel layer 160.

At least one of the charge tunneling layer 150 and the charge blocking layer 130 may include a plurality of layers. For example, the charge tunneling layer 150 may include first and second charge tunneling layers 152 and 154, and the charge blocking layer 130 may include first and second charge blocking layers 132 and 134. The first and second charge tunneling layers 152 and 154 are connected to each other between memory cells, while the charge trap layer 140 and the first and second charge blocking layers 132 and 134 may be separated from each other by the separation layer 120. That is, the charge trap layer 140 and the first and second charge blocking layers 132 and 134 are arranged only between the second charge tunneling layer 154 and the gate electrode 110, and only the separation layer 120 may be arranged in upper and lower portions of the gate electrode 110. Thus, each of the charge trap layer 140, the charge blocking layer 130, and the gate electrode 110 may be in direct contact with the separation layer 120.

The charge tunneling layer 150 is a layer through which electric charges may be tunneled and may include, for example, silicon oxide or metal oxide, but is not limited thereto. In particular, the second charge tunneling layer 154 may not only perform a function of tunneling electric charges but also perform an etch stop function in a manufacturing process of the nonvolatile memory device 100. The second charge tunneling layer 154 may be formed of a dielectric constant material with a dielectric constant greater than 1 and/or a dielectric constant material with a dielectric constant less than 50. The second charge tunneling layer 154 may include a dielectric material including Si, Hf, or Al.

The charge trap layer 140 may store the introduced electric charges. The electric charges (for example, electrons) in the channel layer 160 may flow into the charge trap layer 140 due to a tunneling effect or so on. The electric charges introduced into the charge trap layer 140 may be fixed to the charge trap layer 140. The charge trap layer 140 may include silicon nitride capable of charge trapping.

The charge blocking layer 130 may perform a barrier function of limiting and/or preventing electric charges from transferring between the charge trap layer 140 and the gate electrode 110. A first surface of the charge blocking layer 130 may be in contact with the charge trap layer 140, and a second surface of the charge blocking layer 130 may be in contact with the gate electrode 110. The charge blocking layer 130 may include, for example, silicon oxide or metal oxide but is not limited thereto.

The separation layer 120 may not only serve as a spacer for maintaining an interval between the gate electrodes 110 but also limit and/or prevent the electric charges trapped in the charge trap layer 140 from diffusing to other memory cells. The separation layer 120 may be formed of a material with a low trap concentration or a high trap energy level. For example, the separation layer 120 may be formed of a material with a trap concentration less than $1 \times 10^{19}$ cm$^{-3}$ or a material with a trap energy level higher than 1.0 eV.

The separation layer 120 may include one or more layers. For example, the separation layer 120 may include a first separation layer 122 and a second separation layer 124 that surrounds the first separation layer 122 and are in contact with the gate electrode 110, the charge blocking layer 130, and the charge trap layer 140. A thickness of the first separation layer 122 may be greater than a thickness of the second separation layer 124. For example, the thickness of the first separation layer 122 may be 50 nm or less, and the thickness of the second separation layer 124 may be 5 nm or less.

The first separation layer 122 may have sufficient strength to support a structure of the nonvolatile memory device 100. For example, a hardness of the first separation layer 122 may be greater than a hardness of the second separation layer 124. The first separation layer 122 may be formed of a material such as silicon oxide, silicon nitride, AlN, HfO2, ZrO2, or so on. An air gap may be naturally added during a process of the first separation layer 122.

The second separation layer 124 may limit and/or prevent the electric charges trapped in the charge trap layer 140 from diffusing. The charge tunneling layer 150 and the charge blocking layer 130 may be damaged during a manufacturing process. Thus, defects may be generated in the charge tunneling layer 150 and the charge blocking layer 130, and the defects may cause electric charges to be trapped in the charge tunneling layer 150 and the charge blocking layer 130. The second separation layer 124 may limit and/or prevent charge trapping by removing the defects generated in the charge tunneling layer 150 and the charge blocking layer 130.

A trap concentration of the second separation layer 124 may be different from a trap concentration of the first separation layer 122. The trap concentration of the second separation layer 124 may be greater than the trap concentration of the first separation layer 122. For example, the trap concentration of the second separation layer 124 may be less than $1 \times 10^{19}$ cm$^{-3}$. The second separation layer 124 may limit and/or prevent electric charges from moving from the charge trap layer 140 to the second separation layer 124. The second separation layer 124 may be formed of a material with a chemically stable and low dielectric constant, for example, a material with a dielectric constant of 10 or less. For example, the material may be carbon-doped silicon dioxide (SiOC), fluorine-doped silicon dioxide (SiOF), or a two-dimensional material. The two-dimensional material may be hexagonal boron nitride (h-BN). The second separation layer 124 may reduce coupling between memory cells and cure the damaged charge tunneling layer 150 and the damaged charge blocking layer 130 to increase a breakdown voltage.

Figure 4:
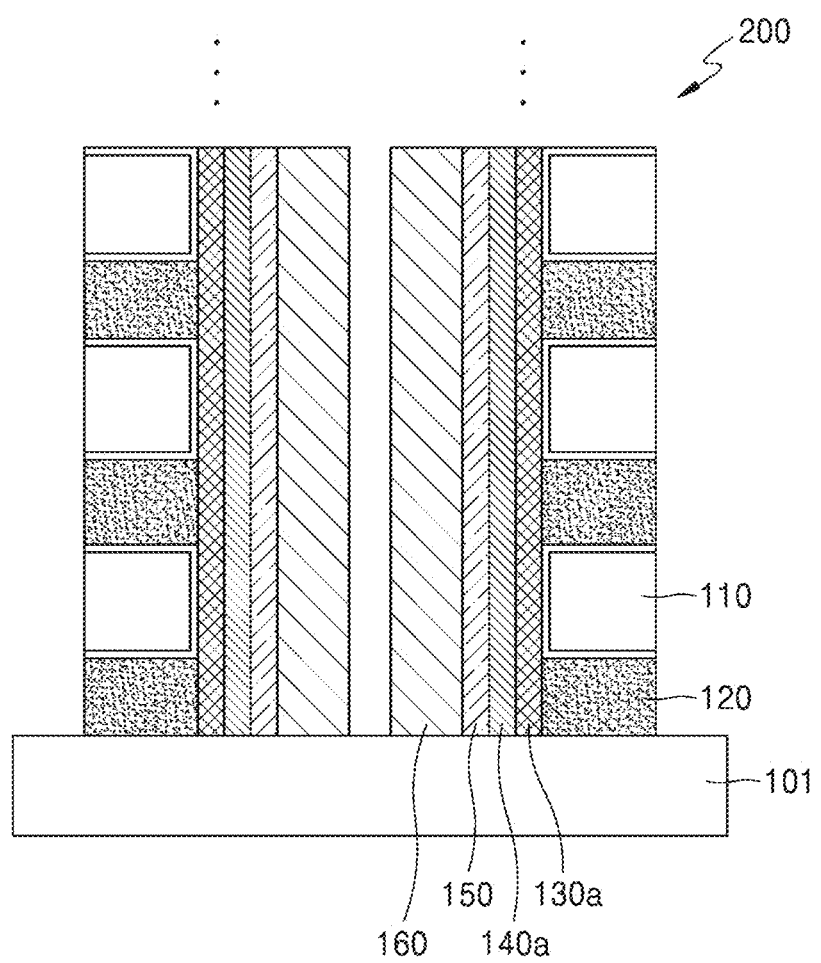
FIG. 4 is a view illustrating a nonvolatile memory device to which an inter-cell charge trap layer is connected as a comparative example.

FIG. 4 is a view illustrating a nonvolatile memory device 200 including a charge trap layer 140a connected between memory cells as a comparative example. When comparing FIGS. 2 and 4 with each other, a charge blocking layer 130a and the charge trap layer 140a of FIG. 4 may be connected to each other between memory cells. Thus, even if electric charges are stored in the charge trap layer 140a, the stored electric charges may diffuse to adjacent memory cells over time. A distance between memory cells, that is, a distance between the gate electrodes 110, may be maintained to a certain distance or more to limit and/or prevent the electric charges from diffusing. This may hinder integration of the nonvolatile memory device 200.

In addition, the charge trap layer 140 according to an embodiment is separated between memory cells by the separation layer 120, and thus, electric charges stored in the charge trap layer 140 do not diffuse to adjacent memory cells even after time passes. Electric charges are not diffused by the separation layer 120, and thus, an interval between the gate electrodes 110 of the nonvolatile memory device 100 according to an embodiment may be less than an interval between the gate electrodes 110 of the nonvolatile memory device 200 according to the comparative example. For example, the interval between the gate electrodes 110 of the nonvolatile memory device 100 according to an embodiment may be 50 nm or less.

FIGS. 5A to 5I are reference views illustrating a method of manufacturing the nonvolatile memory device 100, according the embodiment.

Figure 5A:
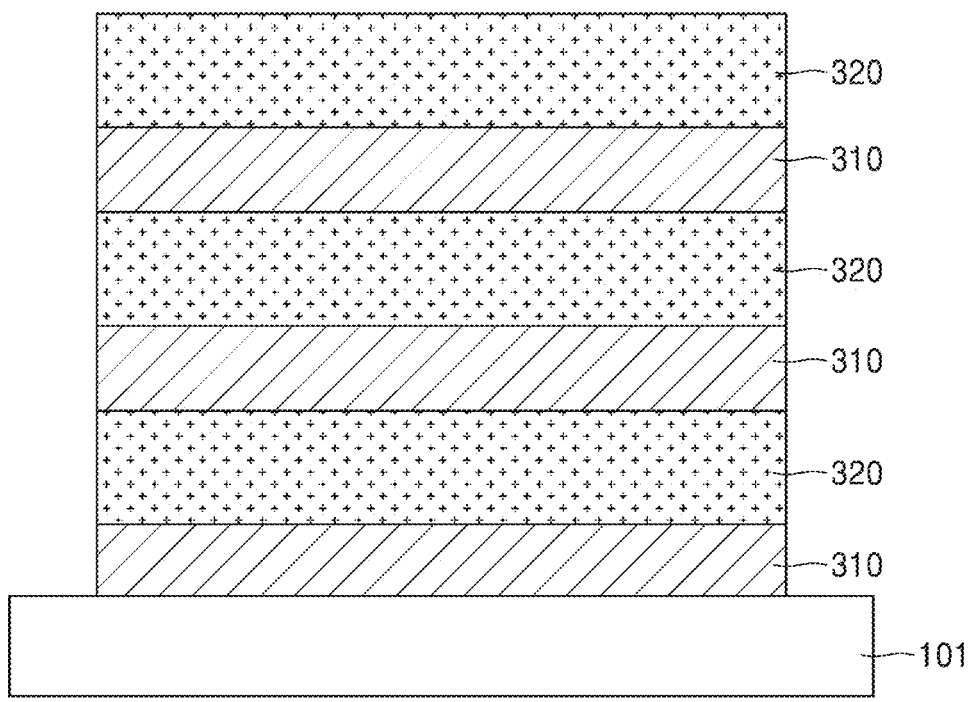
FIGS. 5A to 5I are reference views illustrating a method of manufacturing a nonvolatile memory device according to an embodiment.

As illustrated in FIG. 5A, a first sacrificial layer 310 and a second sacrificial layer 320 are alternately stacked on the substrate 101. The first sacrificial layer 310 and the second sacrificial layer 320 may be alternately stacked in a direction perpendicular to a surface of the substrate 101. The first sacrificial layer 310 and the second sacrificial layer 320 may be formed of different materials. The first sacrificial layer 310 and the second sacrificial layer 320 may include, for example, silicon oxide or silicon nitride but are not limited thereto. The first sacrificial layer 310 and the second sacrificial layers 320 may be formed by using various deposition methods such as chemical vapor deposition (CVD), atomic layer deposition (ALD), or physical vapor deposition (PVD).

Figure 5B:
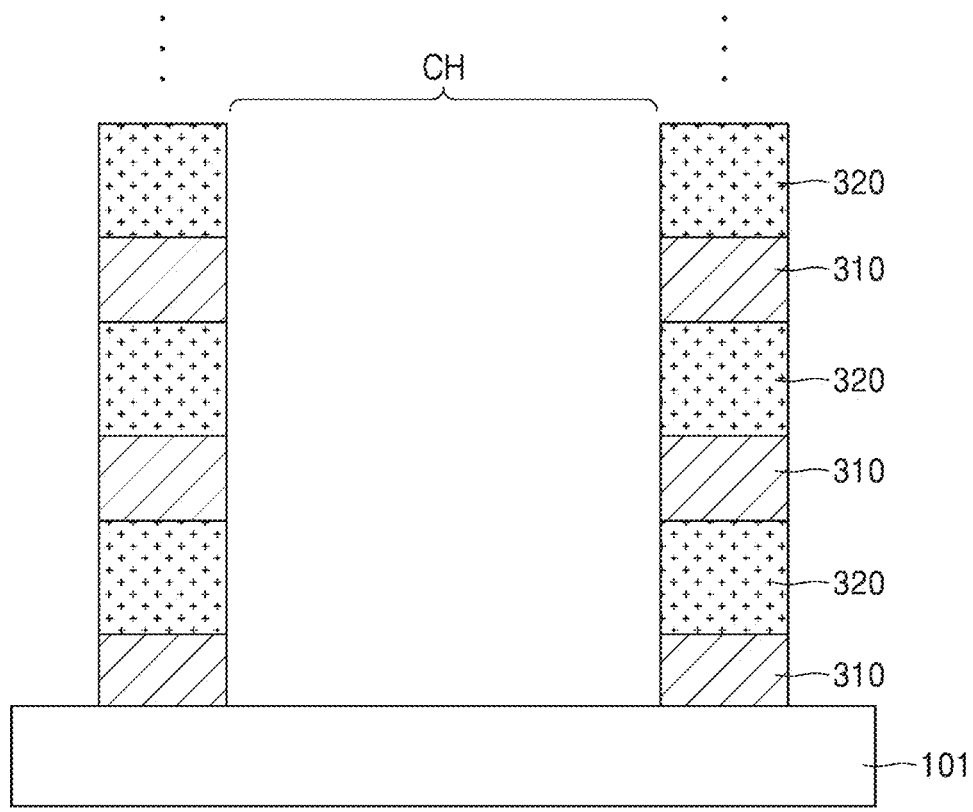

As illustrated in FIG. 5B, the channel hole CH is formed to penetrate the first sacrificial layer 310 and the second sacrificial layer 320. Here, the channel hole CH may be formed to extend in a direction perpendicular to a surface of the substrate 101. The channel hole CH may be formed to have a circular cross-section. The channel hole CH may be formed by anisotropically etching the first sacrificial layer 310 and the second sacrificial layer 320.

Figure 5C:
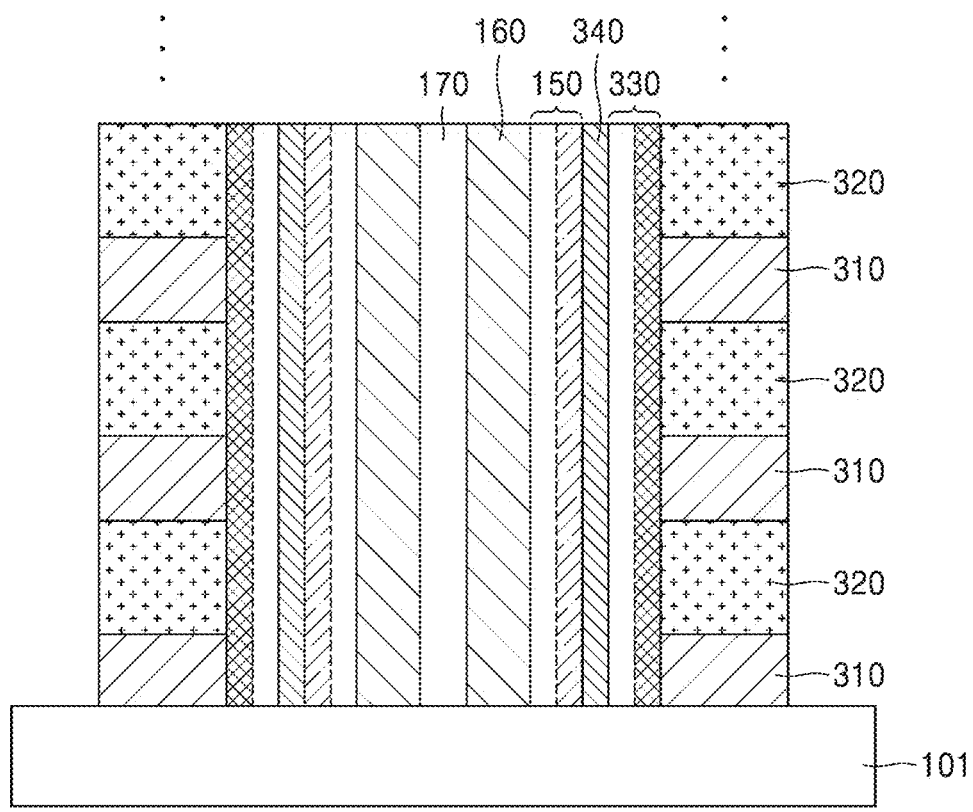

As illustrated in FIG. 5C, a blocking material layer 330, a trap material layer 340, the charge tunneling layer 150, and the channel layer 160 may be sequentially formed on an inner wall of the channel hole CH. The blocking material layer 330, the trap material layer 340, and the charge tunneling layer 150 may be formed to extend in a direction perpendicular to the surface of the substrate 101. The blocking material layer 330 may be formed on the inner wall of the channel hole CH to be in contact with the first sacrificial layer 310 and the second sacrificial layer 320, the trap material layer 340 may be formed to be in contact with an inner wall of the blocking material layer 330, and the charge tunneling layer 150 may be formed to be in contact with an inner wall of the trap material layer 340. The channel layer 160 may be formed to be in contact with the inside of the charge tunneling layer 150. The filling layer 170 may be further formed inside the channel layer 160.

Figure 5D:
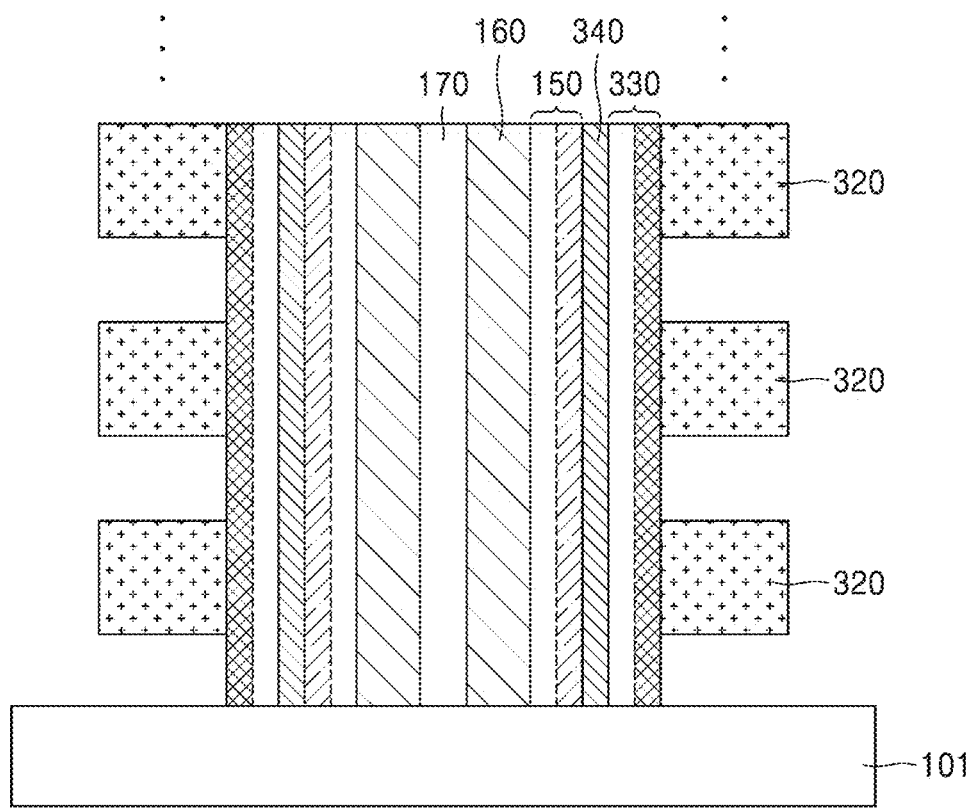

As illustrated in FIG. 5D, the blocking material layer 330 may be exposed by removing the first sacrificial layer 310.

Figure 5E:
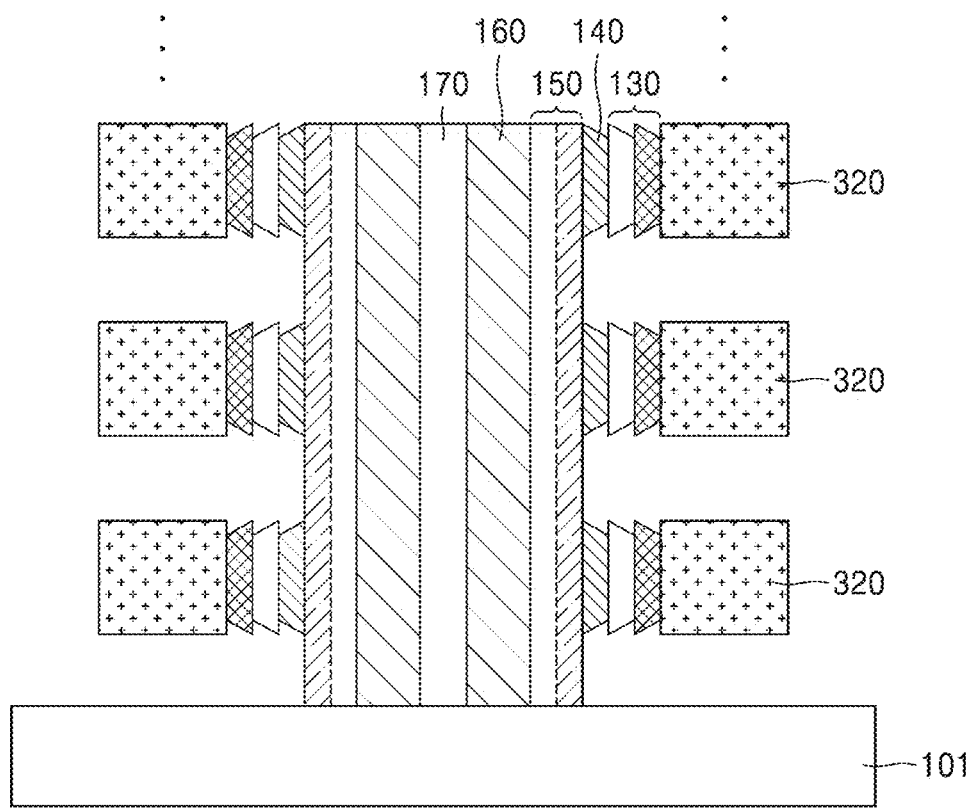

As illustrated in FIG. 5E, the charge blocking layer 130 and the charge trap layer 140 may be formed by partially and sequentially removing the blocking material layer 330 and the trap material layer 340 through a region from which the first sacrificial layer 310 is removed. The blocking material layer 330 and the trap material layer 340 may be etched by an atomic layer etching process or a wet etching process. At least one of the charge blocking layer 130 and the charge trap layer 140 may include a tapered region of which a thickness gradually decreases toward the outside through a wet etching process.

Figure 5F:
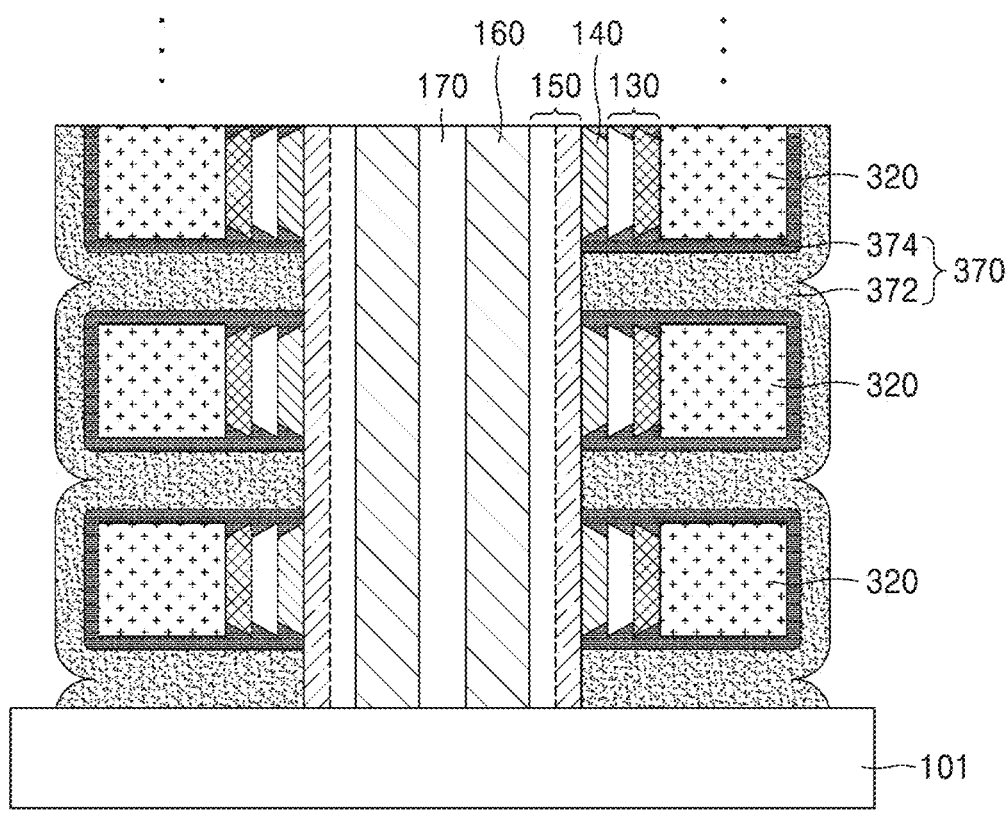

As illustrated in FIG. 5F, a separation material layer 370 may be formed on a region from which the first sacrificial layer 310, the blocking material layer 330, and the trap material layer 340 are removed. A second separation material layer 374 surrounding the second sacrificial layer 320, the charge blocking layer 130, and the charge trap layer 140 may be formed, and a first separation material layer 372 filling the remaining region may be formed. The separation material layer 370 may be formed by using various deposition methods such as CVD, ALD, or PVD.

The separation material layer 370 may be formed of a material with a low trap concentration or a high trap energy level. For example, the separation material layer 370 may be formed of a material with a trap concentration less than $1 \times 10^{19}$ cm$^{-3}$ or a material with a trap energy level higher than 1.0 eV.

The second separation material layer 374 may limit and/or prevent electric charges trapped in the charge trap layer 140 from diffusing. The charge tunneling layer 150 and the charge blocking layer 130 may be damaged during a manufacturing process. The second separation material layer 374 may limit and/or prevent charge trapping by removing defects generated in the charge tunneling layer 150 and the charge blocking layer 130.

A trap energy level of the second separation material layer 374 may be different from a trap energy level of the first separation material layer 372. The trap energy level of the second separation material layer 374 may be higher than the trap energy level of the first separation material layer 372. For example, the trap energy level of the second separation material layer 374 may be higher than 1.2 eV. Thus, electric charges may be limited and/or prevented from moving from the charge trap layer 140 to the second separation material layer 374.

The second separation material layer 374 may be formed of a material that is chemically stable and has a dielectric constant of 10 or less. For example, the second separation material layer 374 may be formed of $Al_2O_3$, SiOC, SiOF, or a two-dimensional material. The two-dimensional material may be h-BN.

The first separation material layer 372 may have a sufficient strength to support a structure of the nonvolatile memory device 100. For example, a hardness of the first separation material layer 372 may be greater than a hardness of the second separation material layer 374. The first separation material layer 372 may be formed of a material such as silicon oxide or silicon nitride.

Figure 5G:
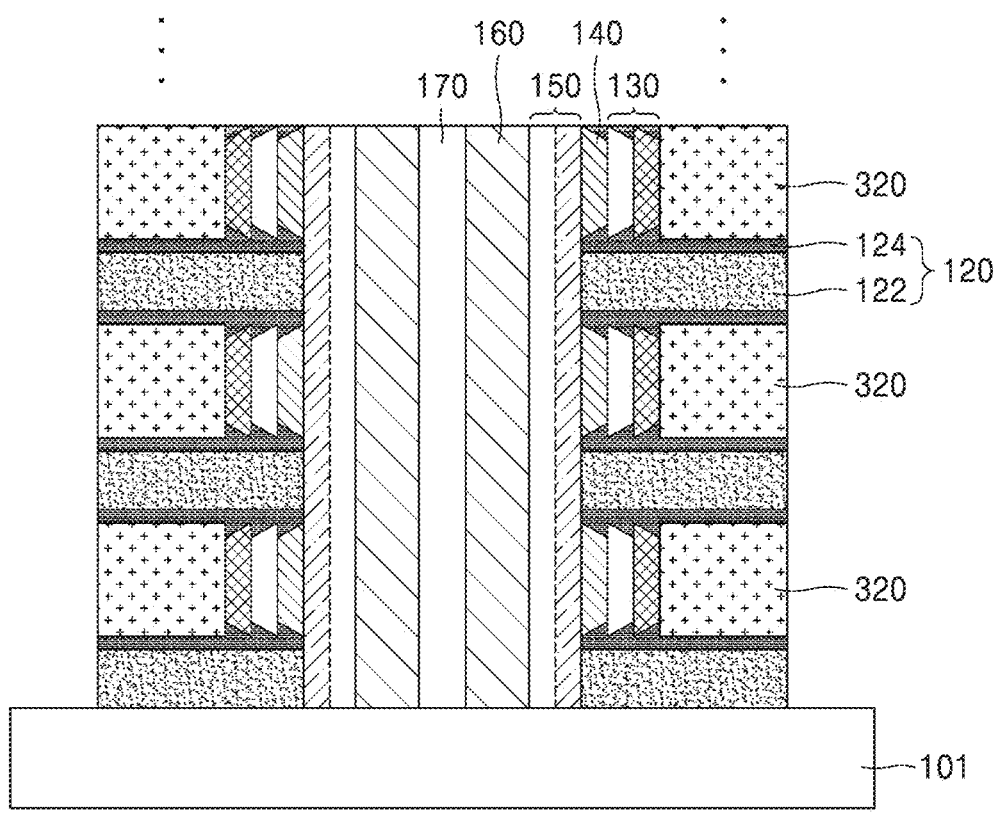

As illustrated in FIG. 5G, forming the separation layer 120 may be completed by removing the separation material layer 370 protruding along an outer surface of the first sacrificial layer 310.

Figure 5H:
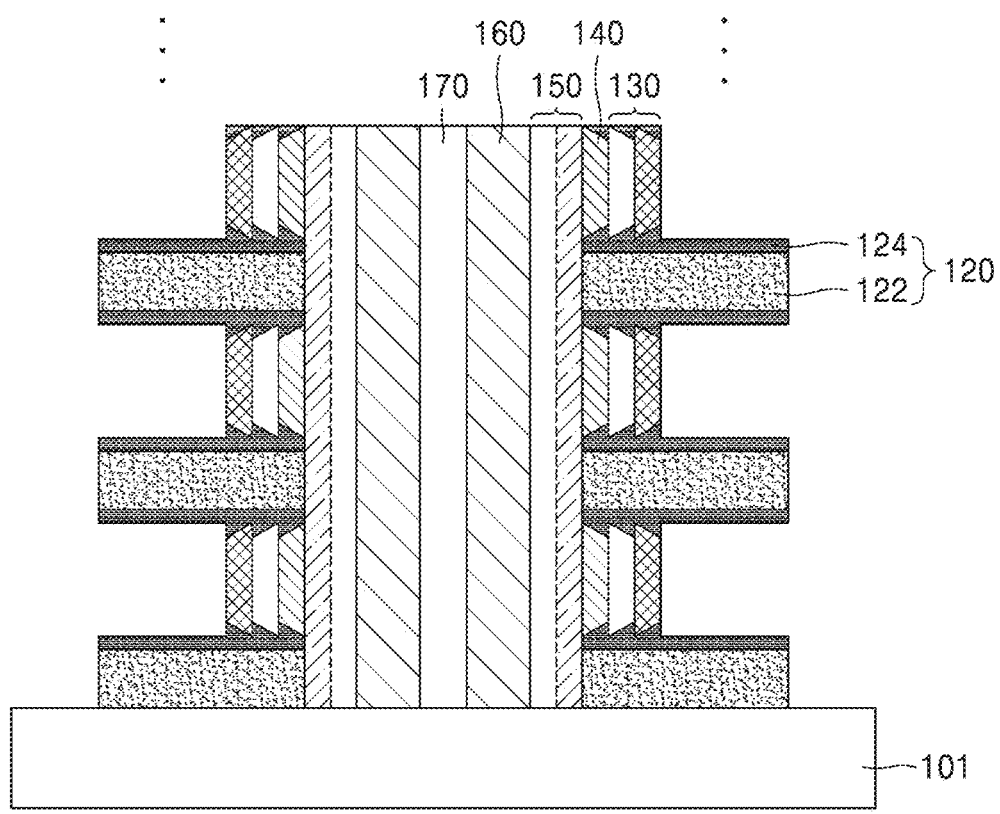
Figure 5I:
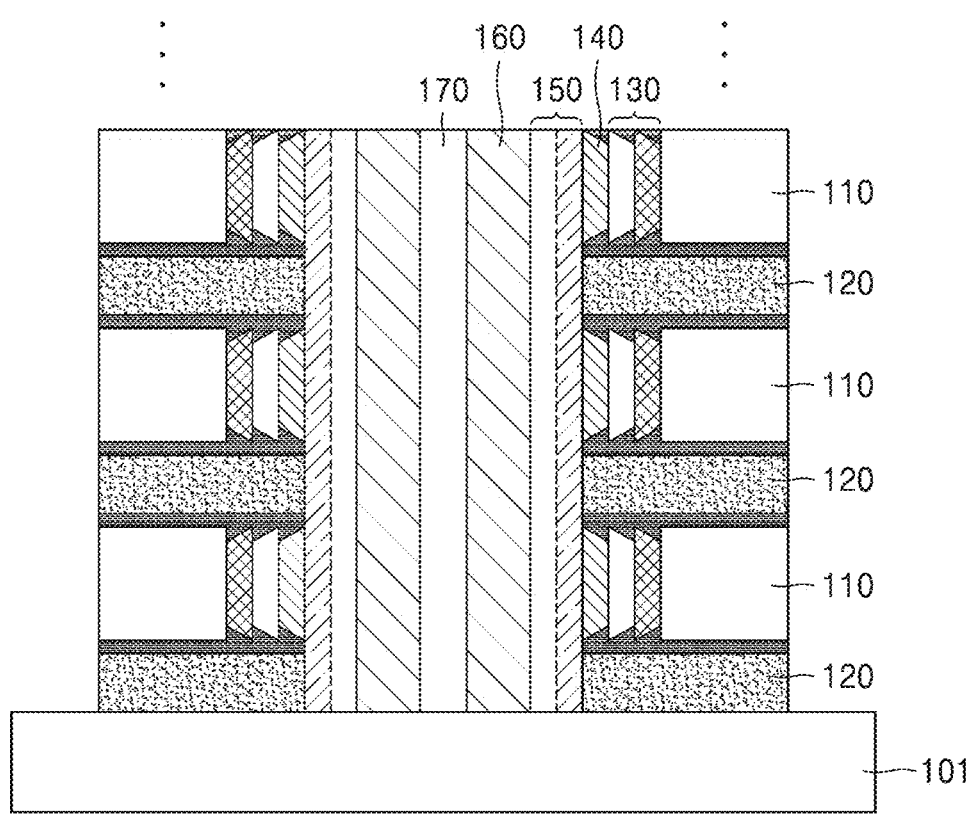

As illustrated in FIG. 5H, the charge blocking layer 130 may be exposed by removing the first sacrificial layer 310. In addition, as illustrated in FIG. 5I, the gate electrode 110 may be formed in a region from which the first sacrificial layer 310 is removed.

Figure 6:
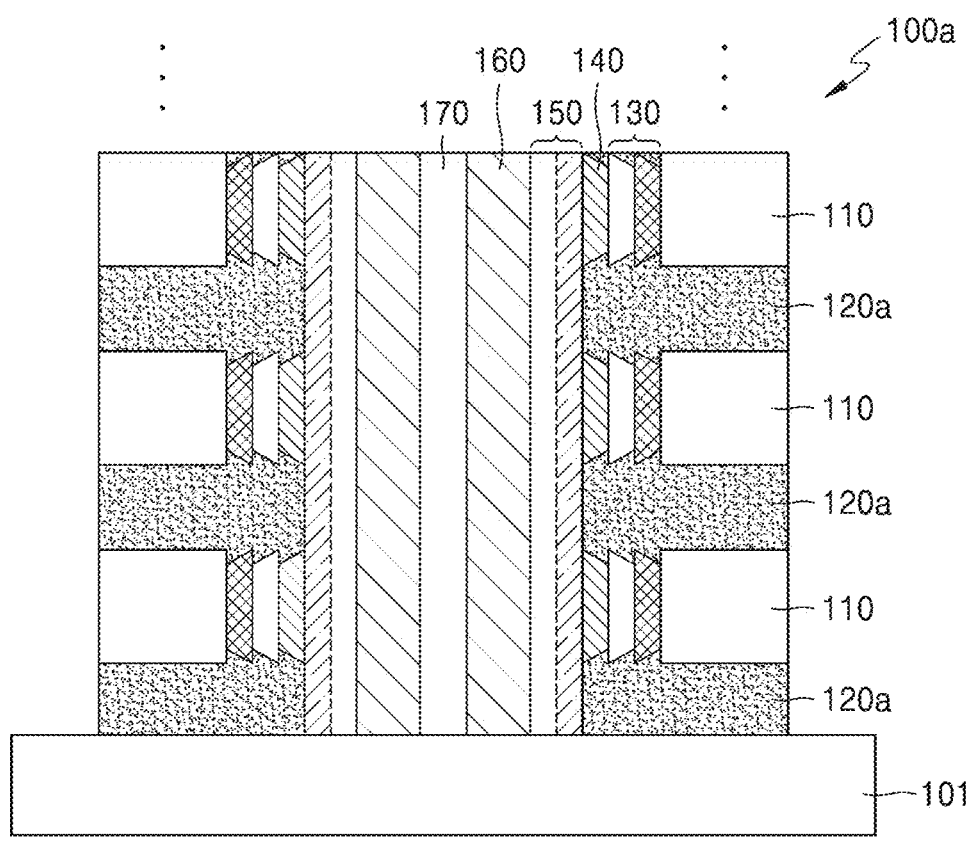
FIG. 6 is a view illustrating part of a nonvolatile memory device according to another embodiment.

FIG. 6 is a view illustrating part of a nonvolatile memory device 100a according to another embodiment. When comparing FIGS. 1 and 6 with each other, the nonvolatile memory device 100a of FIG. 6 may include a separation layer 120a formed as a single layer. For example, the separation layer 120a also may be formed of only a material included in the first separation layer 122 of FIG. 1.

Figure 7:
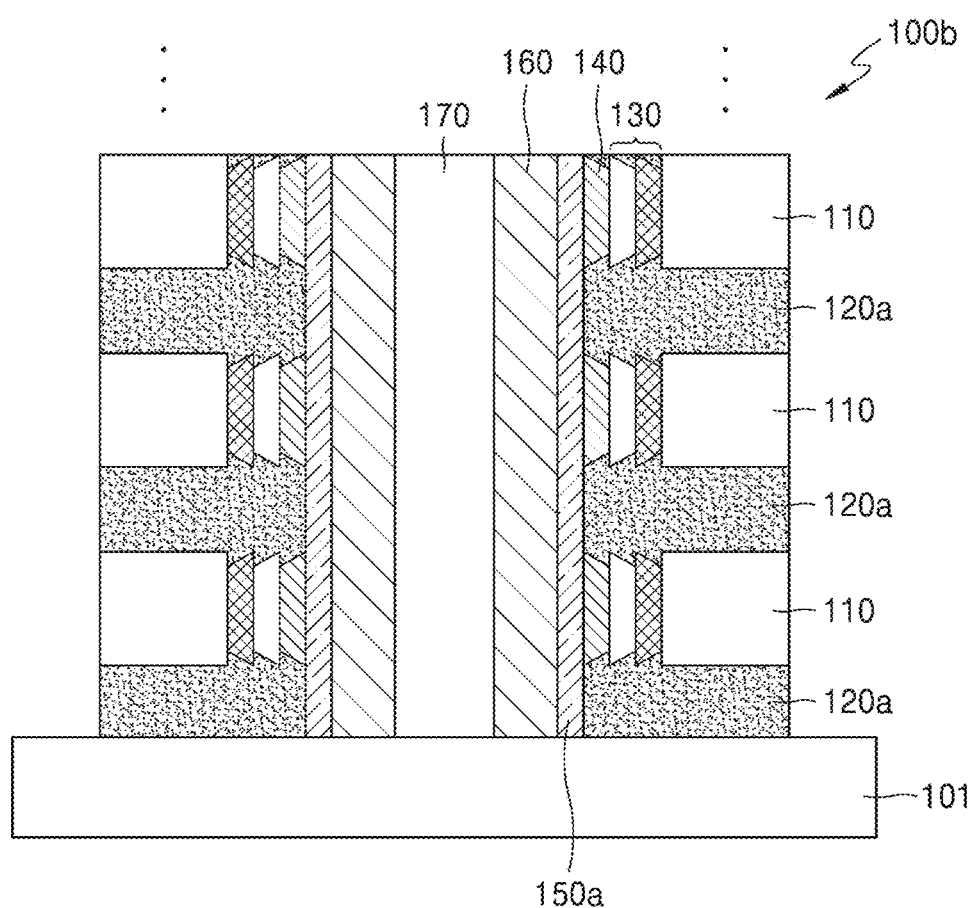
FIG. 7 is a view illustrating part of a nonvolatile memory device according to another embodiment.

FIG. 7 is a view illustrating part of a nonvolatile memory device 100b according to another embodiment. When comparing FIGS. 6 and 7 with each other, the nonvolatile memory device 100b of FIG. 7 may include a charge tunneling layer 150a formed as a single layer. For example, the charge tunneling layer 150a of FIG. 7 may be formed of only a material included in the first charge tunneling layer 152 of FIG. 1.

Figure 8:
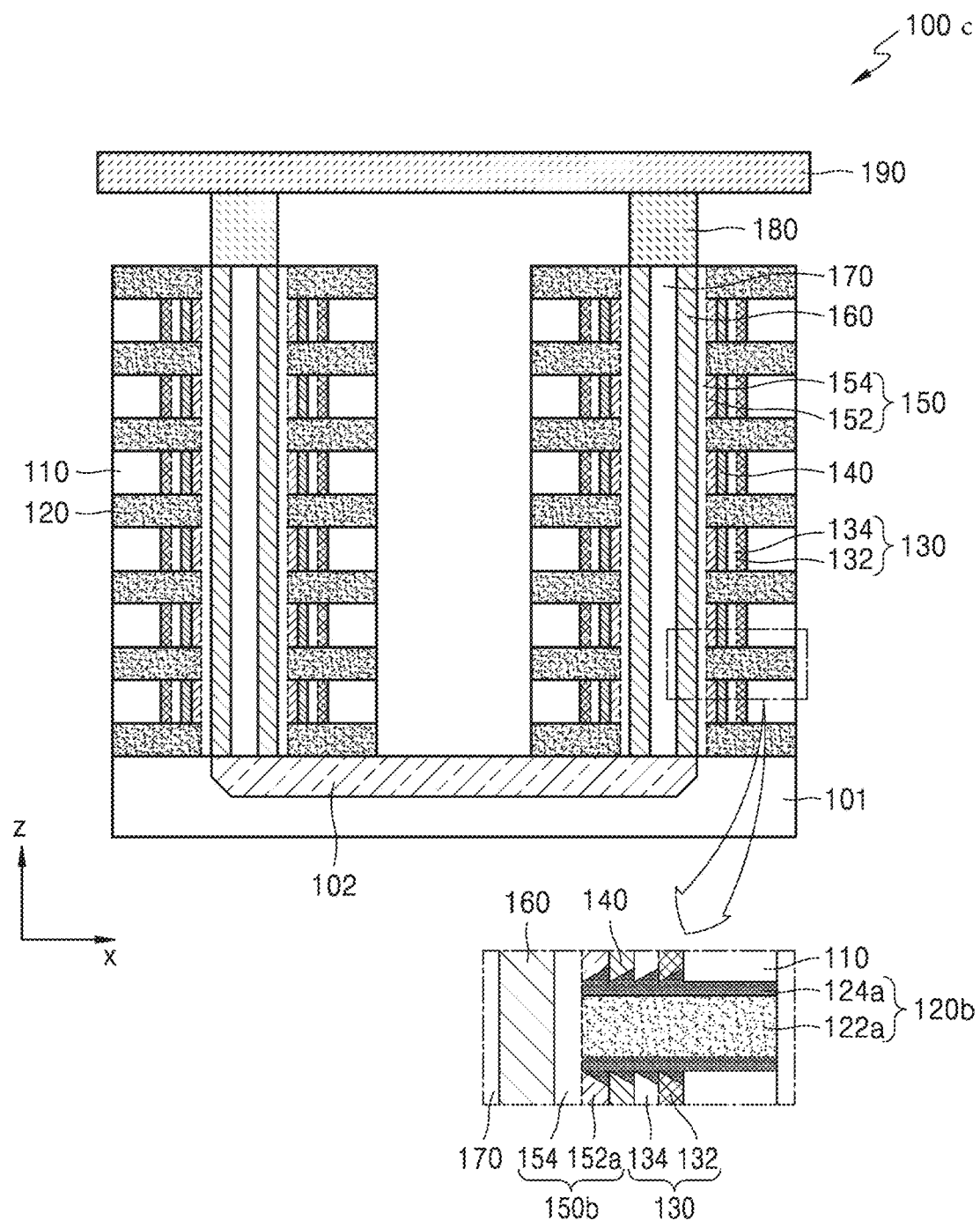
FIG. 8 is a cross-sectional view illustrating a schematic structure of a nonvolatile memory device according to an embodiment.

FIG. 8 is a cross-sectional view illustrating a schematic structure of a nonvolatile memory device according to an embodiment.

When comparing FIGS. 1 and 8 with each other, the nonvolatile memory device 100c of FIG. 8 may include a charge tunneling layer 150b and separation layers 120b having different structures compared to the charge tunneling layer 150 and separation layers 120 in FIG. 1. For example, the charge tunneling layer 150b of FIG. 8 may include first charge tunneling layers 152a alternately arranged in the Z direction between the plurality of separation layers 120b. The charge tunneling layer 150b may further include the second charge tunneling layer 154. The first charge tunneling layers 152a may be between the charge blocking layer 130 and the second charge tunneling layer 154. The first separation layer 122a and second separation layer 124b in each of the of the plurality of separation layers 120b may directly contact the second charge tunneling layer 154 and may extend between adjacent first charge tunneling layers 152a in the Z direction. The first charge tunneling layers 152a each may include a tapered region in which a thickness in the Z direction gradually decreases toward the gate electrode 110. Although not shown in FIG. 8, the nonvolatile memory device 100c may be modified like the nonvolatile memory device 100a in FIG. 6 such that the nonvolatile memory 100c includes separation layers formed as a single layer.

Figure 9:
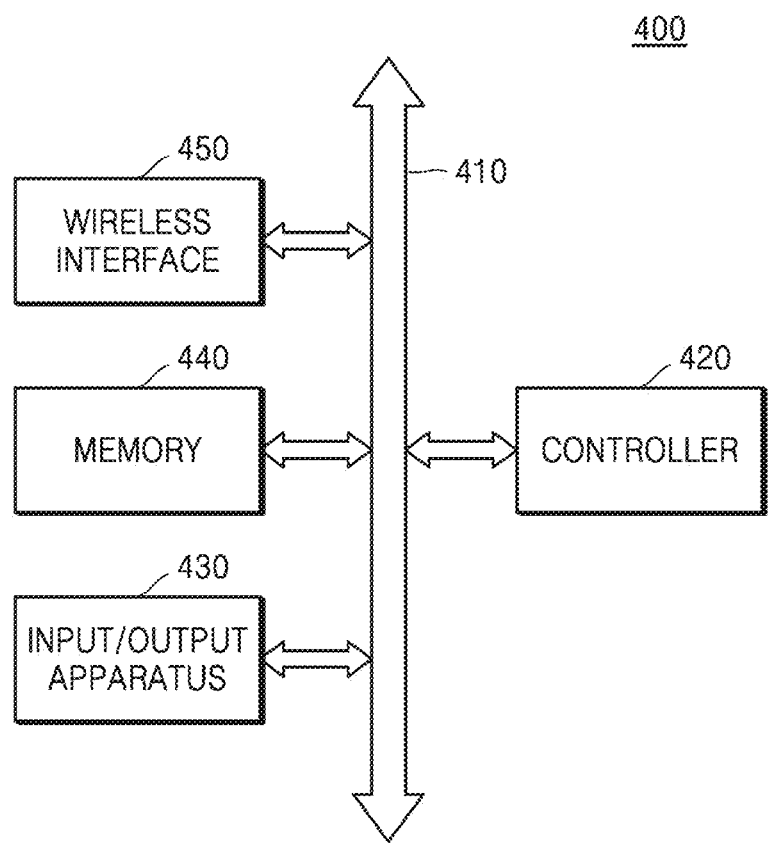
FIG. 9 is a block diagram schematically illustrating an electronic apparatus including a nonvolatile memory device, according to an embodiment.

FIG. 9 is a block diagram schematically illustrating an electronic apparatus 300 including a nonvolatile memory device, according to an embodiment.

Referring to FIG. 9, the electronic apparatus 400 according to an embodiment includes a personal digital assistant (PDA), a laptop computer, a portable computer, a web tablet, a wireless telephone, a mobile phone, a digital music player, a wired/wireless electronic apparatus, or a composite electronic apparatus including at least two thereof. The electronic apparatus 400 may include a controller 420, an input/output apparatus 430 such as a keypad, a keyboard, or a display, a memory 440, and a wireless interface 450 coupled to each other through a bus 410.

The controller 420 may include, for example, one or more microprocessors, a digital signal processor, a microcontroller, or so on. The memory 440 may be used to store commands executed by, for example, the controller 420.

The memory 440 may be used to store user data. The memory 440 may include at least one of the nonvolatile memory devices 100, 100a, 100b, and 100c according to an embodiment.

The electronic apparatus 400 may use the wireless interface 450 to transmit data to a wireless communication network that communicates by using an RF signal or to receive data from the network. For example, the wireless interface 450 may include an antenna, a wireless transceiver, and so on. The electronic apparatus 300 may be used in a communication interface protocol such as a third generation communication system such as code division multiple access (CDMA), global system for mobile communications (GSM), NADC, extended time division multiple access (E-TDMA), wideband code division multiple access (WCDAM), and CDMA2000.

Figure 10:
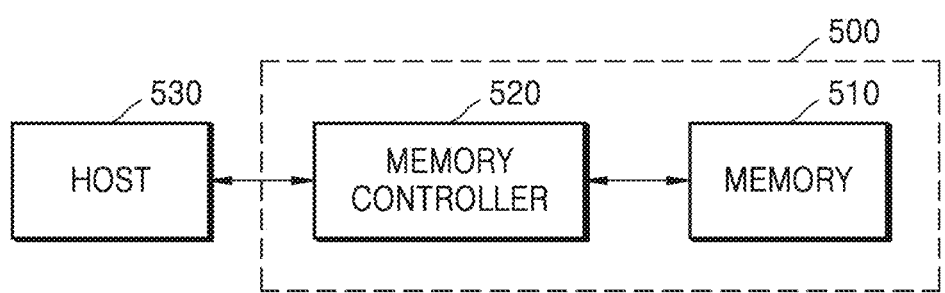
FIG. 10 is a block diagram schematically illustrating a memory system including a nonvolatile memory device, according to an embodiment.

FIG. 10 is a block diagram schematically illustrating a memory system 500 including a nonvolatile memory device, according to an embodiment.

Referring to FIG. 10, the nonvolatile memory devices 100, 100a, 100b, and 100c according to an embodiment may be used to implement the memory system 500. The memory system 500 may include a memory 510 for storing a large amount of data and a memory controller 520. The memory controller 520 controls the memory 510 to read the stored data from the memory 510 or to write data to the memory 510 in response to a read/write request from a host 530. The memory controller 520 may constitute an address mapping table for mapping an address provided from the host 530 such as a mobile apparatus or a computer system into a physical address of the memory 510. The memory 510 may include at least one of the memory devices 100, 100a, 100b, and 100c according to the embodiments of the present disclosure.

Figure 11:
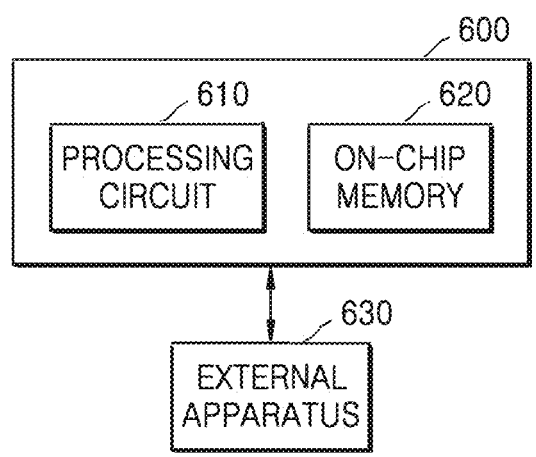
FIG. 11 schematically illustrates a neuromorphic device including a memory device, according to an embodiment.

The memory devices 100, 100a, 100b, and 100c according to the embodiments described above may be implemented in a chip form and may be used as a neuromorphic computing platform. For example, FIG. 11 schematically illustrates a neuromorphic apparatus including a memory device, according to an embodiment. Referring to FIG. 11, a neuromorphic apparatus 600 may include a processing circuit 610 and/or a memory 620. The memory 620 of the neuromorphic apparatus 600 may include the memory system 500 according to the embodiment.

The processing circuit 610 may be configured to control functions for driving the neuromorphic apparatus 600. For example, the processing circuit 610 may control the neuromorphic apparatus 600 by executing a program stored in the memory 620 of the neuromorphic apparatus 600.

The processing circuit 610 may include hardware such as a logic circuit, a combination of software and hardware such as a processor that executes software, or a combination thereof. For example, the processor may include a central processing unit (CPU), a graphics processing unit (GPU), an application processor (AP) in the neuromorphic device 600, an arithmetic logic unit (ALU), a digital processor, a microcomputer, a field programmable gate array (FPGA), a system-on-chip (SoC), a programmable logic unit, a microprocessor, application-specific integrated circuit (ASIC), and so on.

In addition, the processing circuit 610 may read and write various data from and to an external apparatus 630 and operate the neuromorphic device 600 by using the data. The external apparatus 630 may include a sensor array including an external memory and/or an image sensor (for example, a CMOS image sensor circuit).

The neuromorphic device 600 illustrated in FIG. 11 may be applied to a machine learning system. The machine learning system may utilize various processing models and various artificial neural network organizations including, for example, a convolutional neural network (CNN), a deconvolutional neural network, a recurrent neural network (RNN) selectively including a long short-term memory (LSTM) and/or a gated recurrent unit (GRU), a stacked neural network (SNN), a state-space dynamic neural network (SSDNN), a deep belief network (DBN), generative adversarial networks (GANs), and/or restricted Boltzmann machines (RBMs).

The machine learning system may include, for example, linear regression and/or logistic regression, statistical clustering, Bayesian classification, decision trees, dimensionality reduction such as principal component analysis, and another type of machine learning model such as an expert system, and/or a combination thereof including an ensemble technique such as random forest. The machine learning model may be used to provide various services, for example, an image classification service, a user authentication service based on biometric information or biometric data, an advanced driver assistance system (ADAS), a voice assistant service, and an automatic speech recognition (ASR) service and may be installed in other electronic apparatuses to be executed.

The above-described nonvolatile memory devices may reduce a diffusion of electric charges between memory cells.

The above-described nonvolatile memory devices easily implement low power and high integration.

The nonvolatile memory devices 100, 100a, 100b, and 100c are described above with reference to the embodiments illustrated in the drawings, but these are only examples, and those skilled in the art may appreciate that various modifications and equivalent other examples may be derived therefrom.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
   a channel layer extending in a first direction;
   a plurality of gate electrodes and a plurality of separation layers spaced apart from the channel layer and alternately arranged in the first direction;
   a plurality of charge trap layers between the plurality of gate electrodes and the channel layer; and
   a plurality of charge blocking layers between the plurality of charge trap layers and the plurality of gate electrodes, wherein
   the plurality of separation layers separate the plurality of charge trap layers from each other,
   the plurality of separation layers separate the plurality of charge blocking layers from each other, and
   each corresponding charge trap layer among the plurality of charge trap layers, corresponding charge blocking layer among the plurality of charge blocking layers, and corresponding gate electrode among the plurality of gate electrodes is in direct contact with a corresponding separation layer among the plurality of separation layers.

2. The nonvolatile memory device of claim 1, further comprising:
   a charge tunneling layer arranged between the channel layer and the plurality of charge trap layers,
   wherein the charge tunneling layer surrounds the channel layer without being separated by the plurality of separation layers.

3. The nonvolatile memory device of claim 2,
   wherein the charge tunneling layer is in direct contact with the plurality of separation layers.

4. The nonvolatile memory device of claim 1,
   wherein at least one of the corresponding charge trap layer and the corresponding charge blocking layer includes a tapered region in which a thickness gradually decreases toward the corresponding gate electrode.

5. The nonvolatile memory device of claim 1, wherein intervals between the plurality of gate electrodes are 50 nm or less.

6. The nonvolatile memory device of claim 1, wherein the plurality of charge blocking layers include at least one of silicon oxide and metal oxide.

7. The nonvolatile memory device of claim 1, wherein a material in the plurality of separation layers is different from a material of the plurality of charge blocking layers.

8. The nonvolatile memory device of claim 1, wherein the plurality of separation layers have a trap density less than $1\times10^{19}$ cm$^{-3}$.

9. The nonvolatile memory device of claim 1, wherein the plurality of separation layers each comprise a first separation layer and a second separation layer, the second separation layer surrounds the first separation layer, and
the second separation layer of the corresponding separation layer contacts the corresponding charge trap layer and the corresponding charge blocking layer.

10. The nonvolatile memory device of claim 9, wherein a thickness of the first separation layer is greater than a thickness of the second separation layer.

11. The nonvolatile memory device of claim 9, wherein a thickness of the first separation layer is 50 nm or less, and
a thickness of the second separation layer is 5 nm or less.

12. The nonvolatile memory device of claim 9, wherein a trap energy concentration of the first separation layer and a trap energy concentration of the second separation layer are different from each other.

13. The nonvolatile memory device of claim 12, wherein the trap energy concentration of the second separation layer is higher than the trap energy concentration of the first separation layer.

14. The nonvolatile memory device of claim 12, wherein the trap energy concentration of the second separation layer is less than $1\times10^{19}$ cm$^{-3}$.

15. The nonvolatile memory device of claim 9, wherein a hardness of the first separation layer is higher than a hardness the second separation layer.

16. The nonvolatile memory device of claim 9, wherein the second separation layer includes a material with a dielectric constant of 10 or less.

17. The nonvolatile memory device of claim 9, wherein the second separation layer includes at least one of $Al_2O_3$, SiOC, SiOF, and BN.

18. The nonvolatile memory device of claim 9, wherein the first separation layer includes at least one of silicon nitride and silicon oxide.

19. The nonvolatile memory device of claim 1, further comprising:
a drain on an end of the channel layer;
a bit line connected to the drain;
a source connected to an other end of the channel layer;
a source line connected to the source; and
a plurality of word lines respectively connected to the plurality of gate electrodes.

20. An electronic apparatus comprising:
the nonvolatile memory device according claim 1.

21. A nonvolatile memory device comprising:
a common source line; and
a plurality of strings connected to the common source line,
each of the plurality of strings including a channel layer extending in a first direction, a charge tunneling layer extending in the first direction along the channel layer, a plurality of separation layers and a plurality of charge trap layers alternately arranged in the first direction along a surface of the charge tunneling layer, a plurality of gate electrodes alternately arranged in the first direction with the plurality of separation layers, and a plurality of charge blocking layers alternately arranged in the first direction with the plurality of separation layers,
the plurality of strings being spaced apart from each other,
the charge tunneling layer extending between the channel layer and the plurality of charge trap layers,
the plurality of charge blocking layers separating the plurality of gate electrodes from the plurality of charge trap layers, and
the plurality of charge trap layers separating the plurality of separation layers from each other, wherein
in each of the plurality of strings, each corresponding gate electrode among the plurality of gate electrodes is in direct contact with a corresponding separation layer among the plurality of separation layers.

* * * * *